(12) United States Patent
Ookawa et al.

(10) Patent No.: US 7,843,128 B2
(45) Date of Patent: Nov. 30, 2010

(54) ORGANIC ELECTROLUMINESCENT ELEMENT

(75) Inventors: Hideki Ookawa, Yokohama (JP); Junichi Tonotani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 388 days.

(21) Appl. No.: 11/773,609

(22) Filed: Jul. 5, 2007

(65) Prior Publication Data

US 2008/0007162 A1    Jan. 10, 2008

Related U.S. Application Data

(63) Continuation of application No. 11/392,508, filed on Mar. 30, 2006, now abandoned.

(30) Foreign Application Priority Data

Mar. 31, 2005    (JP) .............................. 2005-100328

(51) Int. Cl.
H05B 33/14    (2006.01)
(52) U.S. Cl. ...................... 313/504; 313/507
(58) Field of Classification Search ......... 313/498–512; 315/169.3; 345/36, 45, 76
See application file for complete search history.

(56) References Cited

U.S. PATENT DOCUMENTS

| | | | |
|---|---|---|---|
| 6,350,996 B1 | 2/2002 | Kawai et al. | |
| 6,573,650 B2 | 6/2003 | Aoki et al. | |
| 6,642,069 B2 * | 11/2003 | Armgarth et al. | 438/22 |
| 2004/0002576 A1 | 1/2004 | Oguma et al. | |
| 2004/0021413 A1 | 2/2004 | Ito et al. | |
| 2004/0263056 A1 | 12/2004 | Seo et al. | |
| 2005/0001543 A1 * | 1/2005 | Nomura et al. | 313/504 |

FOREIGN PATENT DOCUMENTS

| | | |
|---|---|---|
| CN | 1719956 A | 1/2006 |
| JP | 2002-500408 | 1/2002 |
| JP | 2004-63139 | 2/2004 |
| JP | 2004-63408 | 2/2004 |
| JP | 2005-32618 | 2/2005 |
| JP | 2005-93402 | 4/2005 |
| JP | 2005-216823 | 8/2005 |
| JP | 2006-24791 | 1/2006 |
| JP | 2006-502254 | 1/2006 |
| JP | 2006-191040 | 7/2006 |
| KR | 2003-0074428 | 9/2003 |
| TW | 2004-202266 | 7/2004 |
| TW | 200626005 | 7/2006 |
| WO | 2004/029176 A1 | 4/2004 |

OTHER PUBLICATIONS

Japanese Notice of Reasons for Rejection mailed Jun. 29, 2010.

* cited by examiner

*Primary Examiner*—Nmeshkumar D Patel
*Assistant Examiner*—Christopher M Raabe
(74) *Attorney, Agent, or Firm*—Oblon, Spivak, McClelland, Maier & Neustadt, L.L.P.

(57) ABSTRACT

Disclosed is an organic electroluminescent element, comprising an anode and a cathode, an organic light-emitting layer interposed between the anode and the cathode, and an organic hole transfer layer containing a polymer type organic hole transfer material having a metal oxide of a semiconductor material or a conductive material added thereto.

11 Claims, 3 Drawing Sheets

ORGANIC ELECTROLUMINESCENT ELEMENT

CROSS-REFERENCE TO RELATED APPLICATIONS

This is a continuation application of U.S. application Ser. No. 11/392,508, filed Mar. 20, 2006.

This application is based upon and claims the benefit of priority from prior Japanese Patent Application No. 2005-100328, filed Mar. 31, 2005, the entire contents of which are incorporated herein by reference.

BACKGROUND OF THE INVENTION

1. Field of the Invention

The present invention relates to an organic electroluminescent element, particularly, to an organic electroluminescent element comprising an improved organic hole transfer layer containing a polymer type organic hole transfer material.

2. Description of the Related Art

The organic electroluminescent element comprises an anode, a cathode and an organic light-emitting layer interposed between the anode and the cathode and exhibiting an electric conductivity and a light-emitting capability. If voltage is applied to the organic electroluminescent element in the forward direction, holes are injected from the anode into the organic light-emitting layer and electrons are injected from the cathode into the organic light-emitting layer. The organic electroluminescent element is a spontaneous light-emitting element, in which these holes and electrons are recombined within the organic light-emitting layer so as to form excitons, and then light is emitted when the excitons are relaxed. Since the organic electroluminescent element permits the process for forming a large display area having a low temperature, the organic electroluminescent element is expected to be applied to a thin film display of the next era.

In such an organic electroluminescent element, the injection of electrons and holes from the electrodes and the mobility of the electrons and holes are controlled by arranging a plurality of layers such as a hole injection layer, a hole transfer layer, an electron transfer layer and an electron injection layer between the anode and the cathode in addition to the organic light-emitting layer. Japanese Patent Application Kokai Publication No. 2004-63408 discloses a hole transfer layer formed of a polymer type hole transfer material such as a so-called "PEDOT:PSS", which is prepared by having poly (ethylenedioxy) thiophene (DEDOT) doped with polystyrenesulphonic acid (PSS). If the hole transfer layer is interposed between the anode and the organic light-emitting layer, it is possible to lower the barrier wall for the hole injection, compared with the case where the holes are injected from the anode formed of a transparent electrode such as ITO directly into the organic light-emitting layer. For example, the barrier wall for the hole injection can be lowered from about 1.0 V to about 0.5 V in the case of forming a hole transfer layer between the anode and the organic light-emitting layer.

However, the organic electroluminescent element comprising the hole transfer layer is defective in that the organic light-emitting layer is deteriorated by the hole transfer layer in the current driving stage so as to shorten the life of the organic electroluminescent element.

BRIEF SUMMARY OF THE INVENTION

According to an aspect of the present invention, there is provided an organic electroluminescent element, comprising: an anode and a cathode;
an organic light-emitting layer arranged between the anode and the cathode; and
an organic hole transfer layer arranged between the anode and the organic light-emitting layer and containing a polymer type organic hole transfer material having a metal oxide of a semiconductor material or a conductive material added thereto.

DETAILED DESCRIPTION OF THE INVENTION

Figure 1:
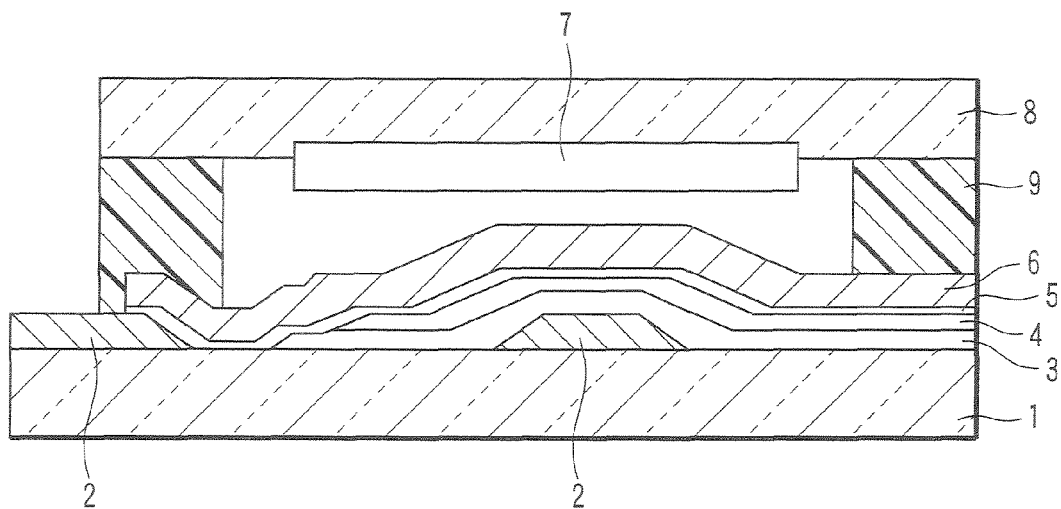
FIG. 1 is a cross sectional view showing the construction of an organic electroluminescent diode for Example 1 of the present invention.

An embodiment of the present invention will now be described in detail.

The organic electroluminescent element for this embodiment is constructed such that a stacked body consisting of an organic light-emitting layer and an organic hole transfer layer is arranged between the anode and the cathode such that the organic hole transfer layer is positioned on the side of the anode. The organic hole transfer layer contains a polymer type organic hole transfer material having a metal oxide of a semiconductor material or a conductive material added thereto.

The anode is formed of a transparent conductive material such as indium oxide doped with tin (ITO).

The cathode has a stacked structure comprising a layer of an alkali metal or an alkaline earth metal having a small work function, e.g., a layer of Li, Ca or Ba, and an Al layer stacked on the layer of the alkali metal or the alkaline earth metal. In the cathode of the stacked structure, the Al layer also acts as a protective film of the alkali metal or the alkaline earth metal that tends to be oxidized easily. Incidentally, in the present invention, it is acceptable for a cathode buffer layer made of, for example, CsF to be interposed between the cathode and the organic light-emitting layer.

The organic light-emitting layer is formed of a material having a polymer type polyparaphenylene vinylene skeleton or a polymer type polyfluorene skeleton.

It is possible for the polymer type organic hole transfer material to be formed of, for example, PEDOT:PSS, which is prepared by having poly (3,4-ethylenedioxy) thiophene (PEDOT) doped with polystyrenesulphonic acid or a salt thereof (PSS). The hole transfer material of PEDOT:PSS is soluble in water and, thus, it is possible to employ an ink jet method or a printing technology for forming a film of the organic hole transfer layer under a liquid state.

A metal oxide of a semiconductor material or a conductive material is added to the polymer type organic hole transfer material. It is desirable to use at least one oxide selected from the group consisting of $MoO_x$, where x denotes an integer of 2 to 3 and $VO_x$, where x denotes an integer of 1 to 2.5 as the metal oxide that is added to the polymer type organic hole transfer material. In particular, $MoO_x$, which is excellent in electric conductivity, has a work function of about −5 V, with the result that the hole injection from the anode made of, for example, ITO into the light-emitting layer (HOMO level of about 5.5 to 6 V) can be facilitated. Also, in the case of using a water-soluble $MoO_x$, the organic hole transfer layer can be formed by the ink jet method or a printing technology by adding $MoO_x$ in advance to the water-soluble PEDOT:PSS.

In operating the organic electroluminescent element, voltage is applied between the anode and the cathode so as to permit the holes to be injected from the anode into the organic light-emitting layer through the organic hole transfer layer and to permit the electrons to be injected from the cathode into the organic light-emitting layer. As a result, the holes and electrons are recombined within the organic light-emitting layer so as to cause the light-emitting layer to emit light spontaneously. According to the embodiment of the present invention, the organic hole transfer layer contains a polymer type organic hole transfer material having a metal oxide of a semiconductor material or a conductive material added thereto, as described above. Because of the particular construction, it is possible to suppress or prevent the deterioration of the organic light-emitting layer, which is brought about by the presence of the organic hole transfer layer when the holes and electrons are recombined within the organic light-emitting layer so as to emit light spontaneously.

Particularly, where the organic hole transfer layer contains polymer type organic hole transfer material prepared by adding at least one oxide, e.g., $MoO_x$, selected from the group consisting of $MoO_x$, where x denotes an integer of 2 to 3 and $VO_x$, where x denotes an integer of 1 to 2.5 to PEDOT:PSS, it is possible to suppress or prevent the deterioration of the organic light-emitting layer during the voltage application between the anode and the cathode. It is considered reasonable to understand that the particular effect of the present invention is produced by the mechanism given below.

Specifically, the deterioration of the organic light-emitting layer during the voltage application (during the driving) is considered to be derived from the diffusion of SO3 separated from PSS in PEDOT:PSS contained in the organic hole transfer layer into the organic light-emitting layer. The added MoOx enters the polymer chain of PEDOT:PSS so as to suppress the separation of SO3 from PSS and also suppress the diffusion of the polymer chain itself containing SO3 into the organic light-emitting layer. In particular, it is possible that the water soluble $MoO_x$ to enter the polymer chain of PEDOT:PSS so as to fix the polymer chain.

As described above, it is possible in the present invention to suppress or prevent the deterioration of the organic light-emitting layer during the voltage application (during the driving of the organic electroluminescent element) so as to make it possible to obtain an organic electroluminescent element having a long life.

The present invention will now be described more in detail with reference to an Example of the present invention.

EXAMPLE 1

In the first step, an anode was prepared by depositing ITO by a sputtering method in a thickness of, for example, 150 nm on the surface of a glass substrate, sized, for example, 24 mm square and 0.7 mm thick, followed by pattering the deposited ITO layer in the shape of a stripe. Then, prepared was an aqueous solution containing about 2% by weight of PEDOT: PSS. Also prepared was an aqueous solution containing 0.049% of $MoO_3$. The aqueous solution of $MoO_3$ was prepared by dissolving a white powdery molybdenum oxide ($MoO_3$) in a pure water at 28° C. Further, the PEDOT:PSS aqueous solution was mixed with the $MoO_3$ aqueous solution at a mixing ratio (PEDOT:PSS aqueous solution : $MoO_3$ aqueous solution) of 10:2 so as to obtain a mixed aqueous solution. The surface of the glass substrate including the anode described above was coated with the mixed aqueous solution by a spin coating method, with the rotating speed of the glass substrate set at about 3,000 to 4,000 rpm, followed by removing the film in the region other than the light-emitting region and subsequently baking the glass substrate at 200° C. so as to form a hole transfer layer.

In the next step, the surface of the hole transfer layer was coated with an ink prepared by dissolving a polyfluorene series blue light-emitting polymer in a tetralin solvent in a concentration of about 2%. The coating was performed by a spin coating method, in which the rotating speed of the glass substrate was set at 2,000 to 3,000 rpm. Further, the resultant ink layer was baked at 150° C. so as to form an organic light-emitting layer. Incidentally, the coating process and the baking process of the light-emitting polymer ink were carried out under a nitrogen gas atmosphere within a glove box. Then, a cathode buffer layer having a thickness of 0.5 nm and formed of CsF was formed by a resistance heating type vacuum deposition, followed by forming a Mg film 10 nm thick and an Al film 150 nm thick by the same vacuum deposition, thereby obtaining a cathode. Further, a cover glass 1.6 mm thick, in which a CaO series getter material (drying agent) was mounted to a groove 0.5 mm deep, was arranged to face the glass substrate such that the drying agent was positioned on the side of the cathode, followed by performing the sealing by using a UV-curing resin so as to manufacture an organic electroluminescent diode constructed as shown in FIG. 1.

The organic electroluminescent diode thus manufactured included the glass substrate 1 having the anode 2 formed on the surface in the shape of a stripe. The anode 2 was formed of an ITO layer having a thickness of, for example, 150 nm. The hole transfer layer 3 prepared by adding 0.49% by weight of molybdenum oxide ($MoO_3$) to PEDOT:PSS was formed on that surface of the glass substrate 1 on which was formed the anode 2. The organic light-emitting layer 4 was formed on the surface of the hole transfer layer 3. The cathode buffer layer 5 was formed on the substrate 1 including the organic light-emitting layer 4. The cathode 6 was formed on the surface of the cathode buffer layer 5. Further, the cover glass 8 having the drying agent 7 mounted thereto was arranged to face and to be fixed to the glass substrate 1 such that the frame-like sealing material 9 formed of a UV-curing resin was interposed between the cover glass 8 and the glass substrate 1. To be more specific, the region of the organic light-emitting layer 4 was sealed by the glass substrate 1, the cover glass 8 having the drying agent mounted thereto, and the frame-like sealing material 9.

COMPARATIVE EXAMPLE 1

An organic electroluminescent diode constructed as shown in FIG. 1 was manufactured as in Example 1, except that PEDOT:PSS alone was used for forming the hole transfer layer. In other words, a metal oxide such as $MoO_x$ was not contained in the hole transfer layer.

Figure 2A:
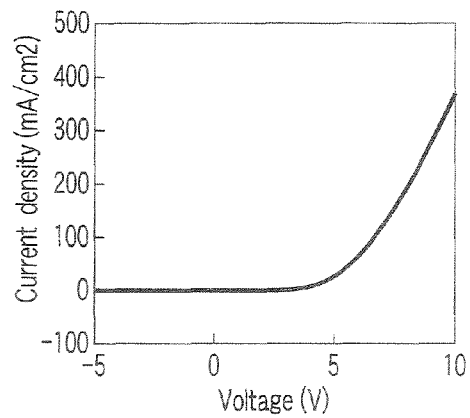
FIGS. 2A and 2B are graphs each showing the current-voltage characteristics of the organic electroluminescent diode for Example 1 of the present invention.
Figure 2B:
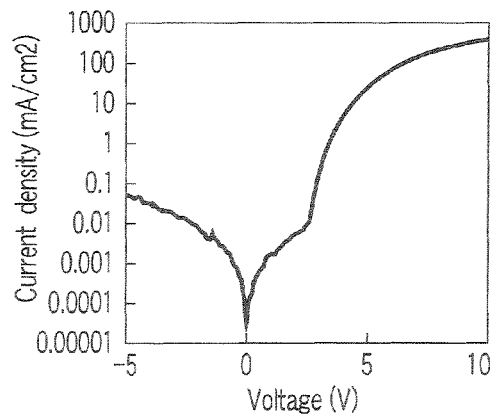
Figure 3A:
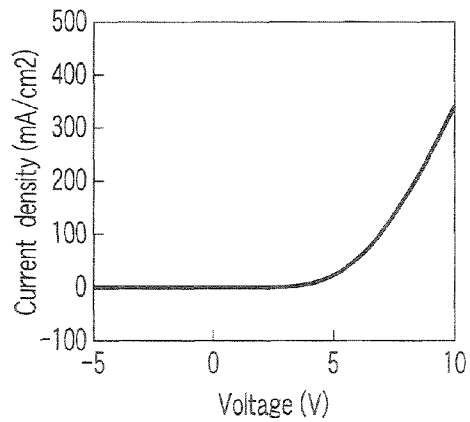
FIGS. 3A and 3B are graphs each showing the current-voltage characteristics of the organic electroluminescent diode for Comparative Example 1.
Figure 3B:
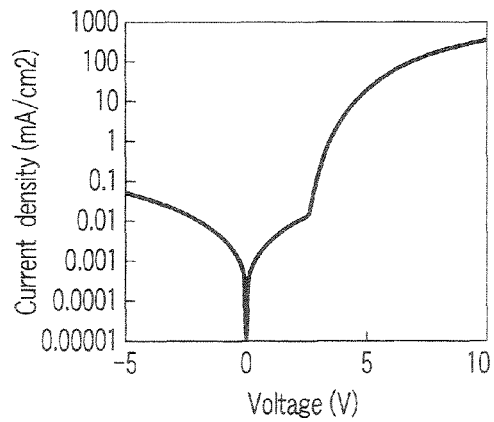

The current-voltage characteristics were examined in respect of the diode manufactured in each of Example 1 and Comparative Example 1. FIGS. 2A and 2B are graphs each showing the current-voltage characteristics of the diode for Example 1 comprising the hole transfer layer formed of PEDOT:PSS+$MoO_3$. On the other hand, FIGS. 3A and 3B are graphs each showing the current-voltage characteristics of the diode for Comparative Example 1 comprising the hole transfer layer formed of PEDOT:PSS alone.

As apparent from FIGS. 2A, 2B, 3A and 3B, the diodes manufactured in Example 1 and Comparative Example 1 were found to be substantially equal to each other in the carrier current (transfer of hole in this case).

Figure 4:
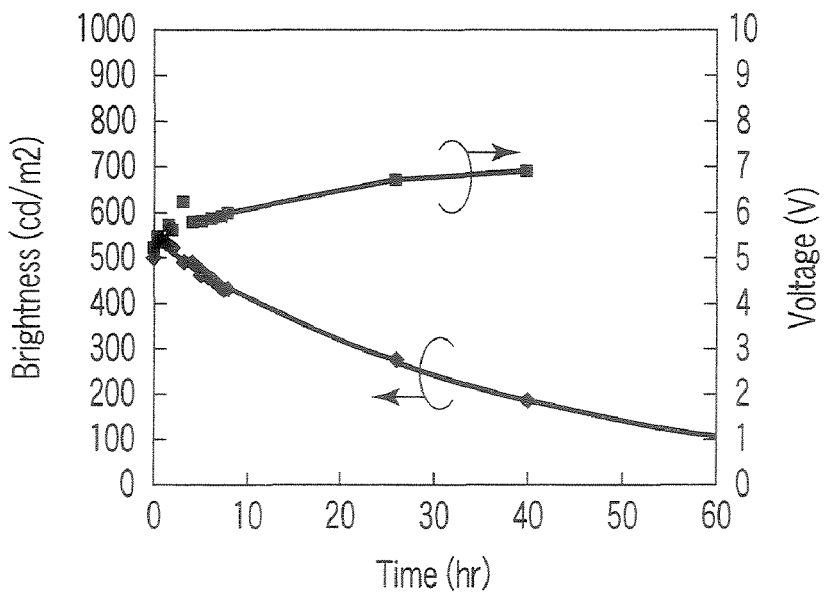
FIG. 4 is a graph showing the changes with the driving time in the brightness and the voltage of the organic electroluminescent diode for Example 1 of the present invention.

Also, the change with time in the brightness of the front surface was examined in respect of the diode manufactured in each of Example 1 and Comparative Example 1 under the condition that the diode was driven under a low current that permitted the initial brightness of about 500 $Cd/m^2$. FIG. 4 is a graph showing the changes with time in the brightness and the voltage during the driving of the diode for Example 1 comprising the hole transfer layer formed of PEDOT:PSS+$MoO_3$. On the other hand, FIG. 5 is a graph showing the changes with time in the brightness and the voltage during the driving of the diode for Comparative Example 1 comprising the hole transfer layer formed of PEDOT:PSS alone.

Figure 5:
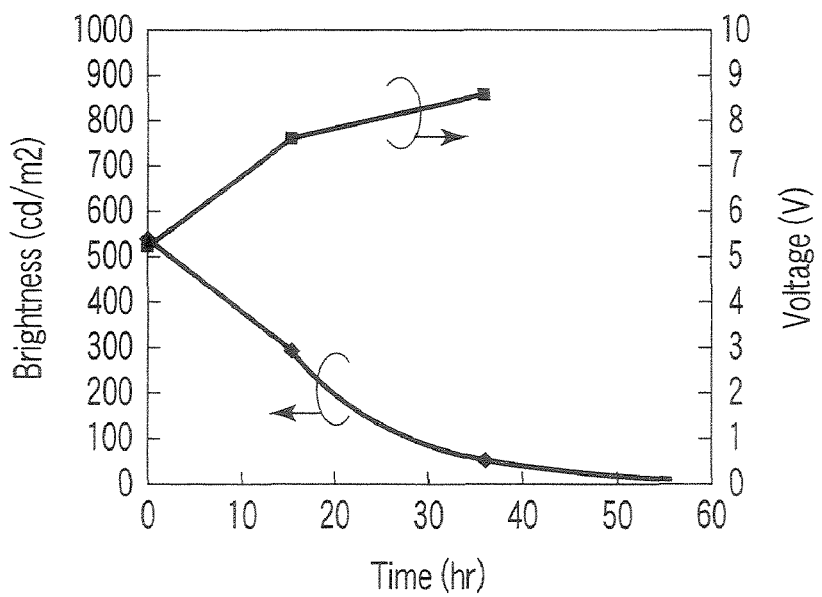
FIG. 5 is a graph showing the changes with the driving time in the brightness and the voltage of the organic electroluminescent diode for Comparative Example 1.

As apparent from FIGS. 4 and 5, it was possible for the diode for Example 1 to suppress the deterioration of the brightness, compared with the diode for Comparative Example 1, so as to improve the life of the diode. To be more specific, the half-life of the brightness, i.e., the time required for the brightness to be lowered to half the initial brightness, for the diode for Example 1 was about 1.8 times as much as that for the diode for Comparative Example 1.

What is claimed is:

1. An organic electroluminescent element, comprising:
   an anode and a cathode;
   an organic light-emitting layer interposed between the anode and the cathode;
   and an organic layer interposed between the anode and the organic light emitting, the organic layer comprising a polymer type organic hole transfer material and a metal oxide of a conductive material added to the hole transfer material,
   wherein the polymer type organic hole transfer material is poly (ethylenedioxy) thiophene doped with polystyrenesulphonic acid or a salt thereof (PSS), and
   the metal oxide is at least one oxide selected from the group consisting of $MoO_x$, and $VO_x$, and the at least one oxide enters between the polymer chains of the poly (ethylenedioxy) thiophene:PSS so as to suppress the separation of a sulfur component from the PSS, thereby suppressing the diffusion of the sulfur component into the organic light-emitting layer.

2. The organic electroluminescent element according to claim 1, wherein the poly (ethylenedioxy) thiophene is poly (2,3-ethylenedioxy) thiophene (PEDOT).

3. The organic electroluminescent element according to claim 1, wherein the organic light-emitting layer is formed of a material having a polymer type polyparaphenylene vinylene skeleton or a polyfluorene skeleton.

4. The organic electroluminescent element according to claim 1, wherein the cathode has a stacked structure comprising a layer of an alkali metal or an alkaline earth metal such as Li, Ca, Ba and an Al layer stacked on the layer of the alkali metal or the alkaline earth metal.

5. The organic electroluminescent element according to claim 1, further comprising a cathode buffer layer formed of CsF, which is interposed between the cathode and the organic light-emitting layer.

6. A method of manufacturing an organic electroluminescent element, comprising:
   forming an anode on the surface of a substrate;
   preparing a water-soluble PEDOT:PSS consisting of poly (3,4-ethylenedioxy) thiophene doped with polystyrenesulphonic acid or a salt thereof;
   mixing the water-soluble PEDOT:PSS with a water-soluble $MoO_x$ or a water-soluble $VO_x$ in the presence of water to prepare a mixed aqueous solution;
   coating the mixed aqueous solution on the surface of the anode to form an organic layer;
   forming an organic light-emitting layer on the surface of the organic layer; and
   forming a cathode on the organic light-emitting layer.

7. The method according to claim 6, wherein the mixed aqueous solution is coated on the surface of the anode by an ink jet method or a printing method.

8. The method according to claim 6, wherein the organic light-emitting layer is made of a material containing a polymer type polyparaphenylene vinylene skeleton or a polyfluorene skeleton.

9. The method according to claim 6, wherein the cathode has a stacked structure comprising a layer of an alkali metal or an alkaline earth metal and an Al layer stacked on the layer of the alkali metal or the alkaline earth metal.

10. The method according to claim 6, which further comprises forming a cathode buffer layer made of CsF on the surface of the organic light-emitting layer prior forming the cathode on the organic light-emitting layer.

11. The method according to claim 9, wherein the alkali metal or alkaline earth metal is Li, Ca, or Ba.

* * * * *